United States Patent
Kim et al.

(10) Patent No.: US 10,325,723 B1
(45) Date of Patent: Jun. 18, 2019

(54) ELECTRONIC COMPONENT

(71) Applicant: SAMSUNG ELECTRO-MECHANICS CO., LTD., Suwon-Si, Gyeonggi-do (KR)

(72) Inventors: Ho Yoon Kim, Suwon-Si (KR); Sang Soo Park, Suwon-Si (KR); Woo Chul Shin, Suwon-Si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/197,850

(22) Filed: Nov. 21, 2018

(30) Foreign Application Priority Data

Sep. 6, 2018 (KR) .................. 10-2018-0106553

(51) Int. Cl.
  *H01G 4/30* (2006.01)
  *H01G 4/012* (2006.01)
  *H01G 2/06* (2006.01)
  *H01G 4/01* (2006.01)
  *H01G 4/248* (2006.01)
  *H05K 1/18* (2006.01)
  (Continued)

(52) U.S. Cl.
  CPC ............. *H01G 4/248* (2013.01); *H01G 4/012* (2013.01); *H01G 4/2325* (2013.01); *H01G 4/30* (2013.01); *H05K 1/181* (2013.01); *H01G 4/1227* (2013.01); *H01G 4/1245* (2013.01); *H05K 1/112* (2013.01); *H05K 2201/10015* (2013.01); *H05K 2201/10378* (2013.01); *H05K 2201/2045* (2013.01)

(58) Field of Classification Search
  CPC ............ H01G 2/06; H01G 4/01; H01G 4/224; H01G 4/248; H01G 4/012; H01G 4/2325; H01G 4/30; H01G 4/1227; H01G 4/1245; H05K 1/141; H05K 1/181; H05K 1/0271; H05K 1/112; H05K 2201/041; H05K 2201/049; H05K 2201/10015; H05K 2201/10378; H05K 2201/2045; H05K 2201/09181
  USPC .......................................... 174/260; 361/303
  See application file for complete search history.

(56) References Cited

U.S. PATENT DOCUMENTS

2004/0066589 A1* 4/2004 Togashi .................. H01G 2/065
  361/15
2013/0037911 A1 2/2013 Hattori et al.
(Continued)

FOREIGN PATENT DOCUMENTS

JP 2012-204572 A 10/2012
JP 5472230 B2 4/2014
JP 5794256 B2 10/2015

*Primary Examiner* — Timothy J Thompson
*Assistant Examiner* — Guillermo J Egoavil
(74) *Attorney, Agent, or Firm* — Morgan, Lewis & Bockius LLP

(57) ABSTRACT

An electronic components includes: a multilayer capacitor including a capacitor body and a pair of external electrodes, an interposer including an interposer body and a pair of external terminals, and an adhesive; wherein the external terminal includes a bonding portion, a mounting portion, and a connection portion; wherein an adhesive is provided between the external electrode and the bonding portion, and falls along the connection portion of the external terminal; wherein $1.55 \leq (L+T2^2)/T1$ in which T2 is a height at which the adhesive falls along the connection portion of each of the external terminals, L is a length of the bonding portion, and T1 is a height of the electronic component.

17 Claims, 5 Drawing Sheets

(51) Int. Cl.
*H01G 4/232* (2006.01)
*H01G 4/12* (2006.01)
*H05K 1/11* (2006.01)

(56) References Cited

U.S. PATENT DOCUMENTS

| | | | |
|---|---|---|---|
| 2014/0016242 A1* | 1/2014 | Hattori | H01G 2/06 361/303 |
| 2014/0041914 A1* | 2/2014 | Hattori | H05K 1/181 174/260 |
| 2014/0284089 A1 | 9/2014 | Hattori et al. | |
| 2016/0088733 A1* | 3/2016 | Lee | H05K 3/3442 361/768 |
| 2016/0120027 A1* | 4/2016 | Park | H01G 4/30 174/260 |

* cited by examiner

ELECTRONIC COMPONENT

CROSS-REFERENCE TO RELATED APPLICATION(S)

This application claims the benefit of priority to Korean Patent Application No. 10-2018-0106553, Sep. 6, 2018, in the Korean Intellectual Property Office, the disclosure of which is incorporated herein by reference in its entirety.

TECHNICAL FIELD

The present disclosure relates to an electronic component.

BACKGROUND

A multilayer capacitor has been used as a component of various electronic devices due to advantages thereof such as compactness and high capacitance.

Such a multilayer capacitor has a structure in which a plurality of dielectric layers and internal electrodes having different polarities are alternately arranged while being interposed between the dielectric layers.

In this case, the dielectric layers have piezoelectric properties. Accordingly, when a direct current (DC) voltage or an alternating current (AC) voltage is applied to the multilayer ceramic capacitor, a piezoelectric phenomenon may occur between the internal electrodes. As a result, the volume of a ceramic body is expanded and contracted depending on a frequency, to cause periodic vibrations.

During board mounting, the vibrations may be transmitted to the board through a solder connecting external electrodes of the multilayer ceramic capacitor to the board. Thus, the entire board may become an acoustic reflective surface to generate a vibration sound to be a noise.

The vibration sound may be in an audible frequency region of 20 Hz to 20,000 Hz, causing listener discomfort. The vibration sound causing listener discomfort is referred to as an acoustic noise.

An electronic component using an interposer disposed between a multilayer capacitor and a board is disclosed as a method of reducing such an acoustic noise.

However, in the case of an electronic component using a conventional interposer, an acoustic-noise reduction effect may not be as high as expected or fixing strength may not be secured during board mounting, resulting in poor mounting.

Accordingly, there is need for a technique to secure fixing strength of a certain level or higher while effectively further reducing an acoustic noise of a multilayer capacitor.

SUMMARY

An aspect of the present disclosure is to provide an electronic component having fixing strength secured therein while maintaining an acoustic-noise reduction effect at a certain level or higher.

According to an aspect of the present disclosure, an electronic component includes a multilayer capacitor including a capacitor body and a pair of external electrodes respectively disposed on both ends of the capacitor body and an interposer including an interposer body having both ends in which grooves are respectively formed and a pair of external terminals respectively disposed on both the ends of the interposer. The external terminal includes a bonding portion disposed on a top surface of the interposer body and connected to the external electrode, a mounting portion disposed on a bottom surface of the interposer body, and a connection portion disposed on a groove of the interposer body to connect the bonding portion and the mounting portion to each other. An adhesive is provided between the external electrode and the bonding portion. The adhesive falls along the connection portion of the external terminal. When a height at which the adhesive falls along the connection portion of the external terminal is defined as T2, a length of the bonding portion is defined as L, and a height of the electronic component is defined as T1, $(L+T2^2)/T1$ satisfies $1.55 \leq (L+T2^2)/T1$.

The multilayer capacitor may have a height of 0.7 millimeters or less.

The adhesive may be a high melting-point solder.

In an exemplary embodiment, the interposer body may be formed of an insulating board.

In an exemplary embodiment, the capacitor body may include a plurality of first and second internal electrodes including first and second surfaces disposed to oppose each other, third and fourth surfaces connected to the first and second surfaces and disposed to oppose each other, and fifth and sixth surfaces connected to the first and second surfaces as well as the third and fourth surfaces and disposed to oppose each other and a plurality of dielectrics. The plurality of first and second internal electrodes may be alternately arranged with a plurality of dielectric layers while the dielectric layer is interposed between the first and second internal electrodes in a direction in which the first and second surfaces are connected to each other.

In an exemplary embodiment, one end of the first internal electrode and one end of the second internal electrode may be exposed through the third surface and the fourth surface, respectively.

In an exemplary embodiment, the external electrode may include head portions respectively disposed on the third and fourth surfaces of the capacitor body and respectively connected to the first and second internal electrodes and a band portion extending to a portion of the first surface of the capacitor body from one of the head portions. The band portion may be connected to the bonding portion.

In an exemplary embodiment, the electronic component may further include plating layers respectively provided on surfaces of the external electrode and the external terminal.

In an exemplary embodiment, each of the plating layers may include a nickel plating layer and a tin plating layer covering the nickel plating layer.

In an exemplary embodiment, the multilayer capacitor may have a length of 0.8 millimeter or less and a width of 0.4 millimeter.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
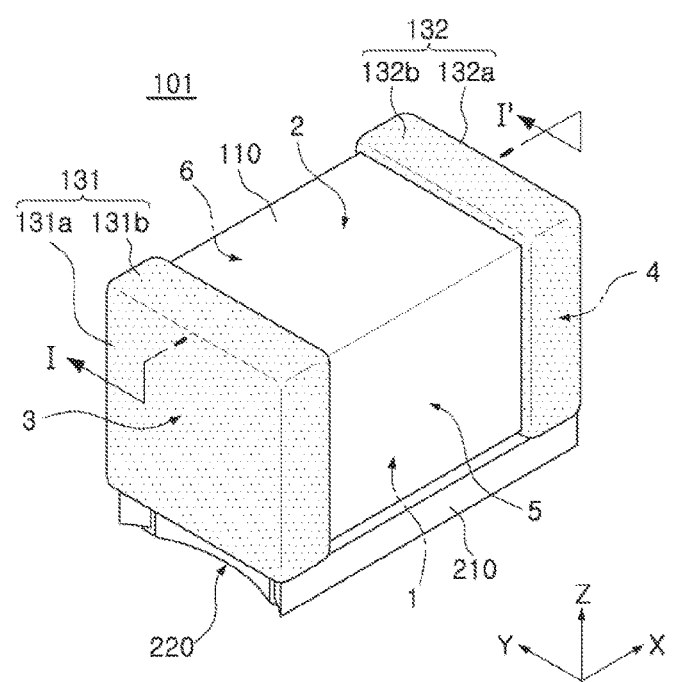
FIG. 1 is a perspective view of an electronic component according to an exemplary embodiment in the present disclosure.

Hereinafter, embodiments of the present disclosure will be described as follows with reference to the attached drawings. In the accompanying drawings, shapes, sizes, and the like, of components may be exaggerated or stylized for clarity.

The present disclosure may, however, be exemplified in many different forms and should not be construed as being limited to the specific embodiments set forth herein. Rather these embodiments are provided so that this disclosure will be thorough and complete, and will fully convey the scope of the disclosure to those skilled in the art.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the accompanying drawings. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

The present disclosure may, however, be embodied in many different forms and should not be construed as being limited to the embodiments set forth herein.

Rather, these embodiments are provided so that this disclosure will be thorough and complete, and will fully convey the scope of the preset disclosure to those skilled in the art.

In the drawings, the shapes and dimensions of elements may be exaggerated for clarity.

The same reference numerals will be used throughout to designate the same or like elements.

Terms used in the present specification are for explaining the embodiments rather than limiting the present disclosure. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

In the specification, directions will be defined to clearly describe exemplary embodiments in the present disclosure. In drawings, X, Y, and Z will denote a length direction, a width direction, and a thickness direction of a multilayer capacitor and an interposer, respectively.

In exemplary embodiments, a Z direction may be used to have the same concept as a direction in which a dielectric layer is laminated.

Figure 2:
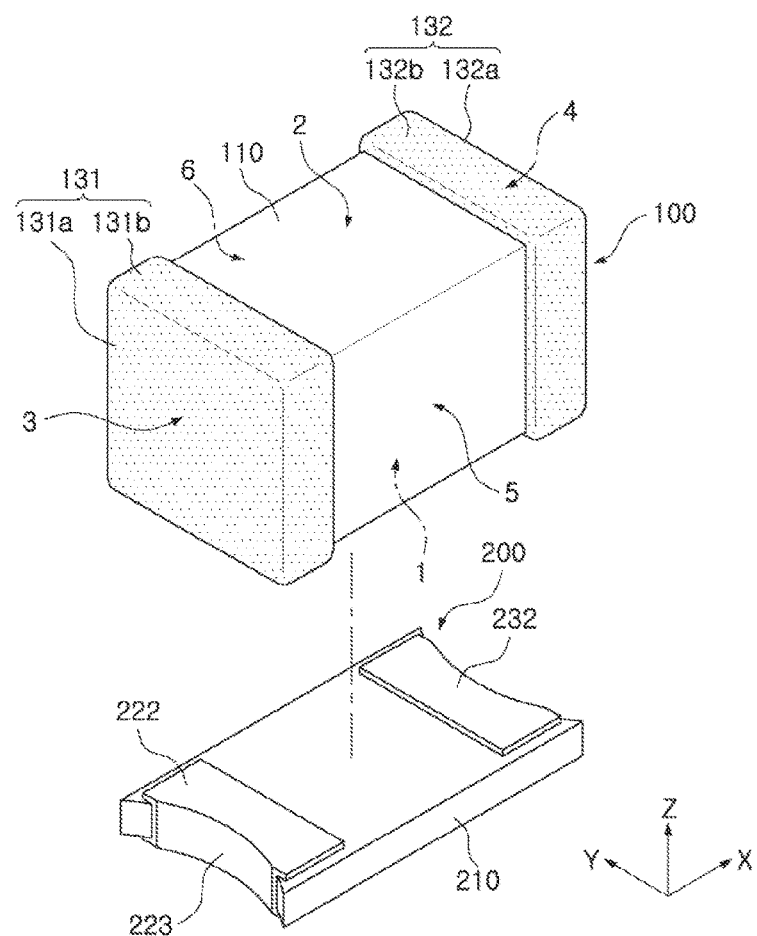
FIG. 2 is an exploded perspective view of FIG. 1.

FIG. 1 is a perspective view of an electronic component according to an exemplary embodiment in the present disclosure. FIG. 2 is an exploded perspective view of FIG. 1, and FIG. 3 is a cross-sectional view taken along line I-I' in FIG. 1.

Figure 3:
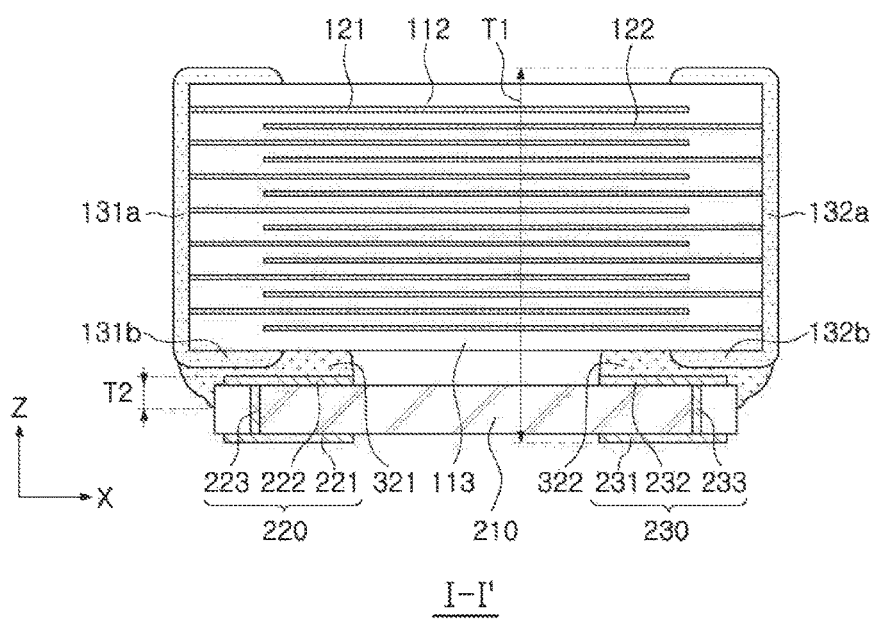
FIG. 3 is a cross-sectional view taken along line I-I' in FIG. 1.

Referring to FIGS. 1 to 3, an electronic component 101 according to an exemplary embodiment includes a multilayer capacitor 100 and an interposer 200.

Hereinafter, a structure of the multilayer capacitor 100 applied to the electronic component 101 according to the present embodiment will be described below.

The multilayer capacitor 100 includes a capacitor body 110 and first and second external electrodes 131 and 132 disposed respectively on both ends in X direction of the capacitor body 100.

In an embodiment, the multilayer capacitor 100 may have an X direction length of 0.8 millimeters (mm) or less and a Y-direction width of 0.4 mm or less. In addition, the multilayer capacitor 100 may have a height of 0.7 mm or less.

The capacitor body 110 is formed by laminating a plurality of dielectric layers 111 and sintering the laminated dielectric layers 111. Adjacent dielectric layers 211*a* may be integrated with each other such that boundaries therebetween may not be readily apparent without using a scanning electron microscope (SEM).

In addition, the capacitor body 110 includes first and second internal electrodes 121 and 122 having different polarities. The first and second electrodes 121 and 122 are alternately arranged with the plurality of dielectric layers 111 in the Z direction while being interposed between the dielectric layers 111.

The capacitor body 110 may include an active region as a portion contributing to formation of capacitance of the multilayer capacitor 110 and a cover region as a margin portion prepared in both side portions of the capacitor body 111 in a Y direction and prepared in upper and lower portions of the active region in the Z direction.

The capacitor body 110 is not limited in shape, but may have a hexahedral shape. The capacitor body 110 may include first and second surfaces 1 and 2 disposed to oppose each other in the Z direction, third and fourth surfaces 3 and 4 connected to the first and second surfaces 1 and 2 and disposed to oppose each other in the X direction, and fifth and sixth surfaces 5 and 6 connected to the first and second surfaces 1 and 2 as well as the third and fourth surfaces 3 and 4 and disposed to oppose each other.

The dielectric layer 111 may include a ceramic powder, for example, a barium titanate ($BaTiO_3$)-based ceramic powder or the like.

The $BaTiO_3$-based ceramic powder may be $(Ba1-xCax)TiO_3$, $Ba(Ti1-yCay)O_3$, $(Ba1-xCax)(Ti1-yZry)O_3$, or $Ba(Ti1-yZry)O_3$ in which calcium (Ca) or zirconium (Zr) is partially employed in $BaTiO_3$, but a material of the ceramic powder is not limited thereto.

In addition to the ceramic powder, a ceramic additive, an organic solvent, a plasticizer, a binders, and a dispersant may be further added to the dielectric layer 111.

The ceramic additive may include, for example, a transition metal oxide or a transition metal carbide, a rare earth element, magnesium (Mg), aluminum (Al), or the like.

Figure 4A:
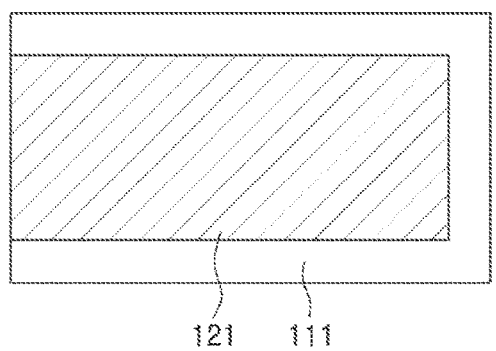
FIGS. 4A and 4B are plan views of a first internal electrode and a second internal electrode of a multilayer capacitor applied to FIG. 1, respectively.
Figure 4B:
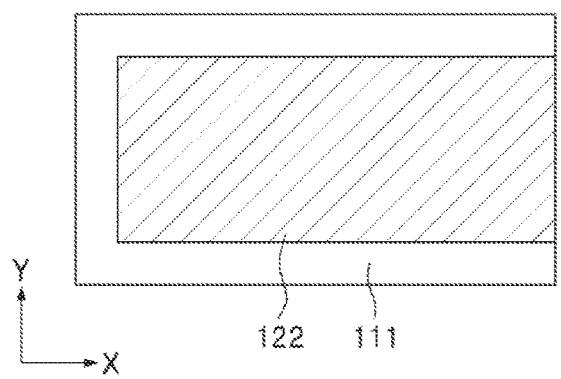

Further referring to FIGS. 4A and 4B, the first and second internal electrodes 121 and 122, as electrodes applied with different polarities, may be disposed on the dielectric layer 111 to be laminated in the Z direction. The first and second internal electrodes 121 and 122 may be alternately arranged to oppose each other with a single dielectric layer 111 interposed therebetween inside the capacitor body 110 in the Y direction.

In this case, the first and second internal electrodes 121 and 122 may be electrically insulated from each other by the dielectric layer 111 disposed in the middle thereof.

While a structure in which internal electrodes are laminated in the Z direction has been described in the present disclosure, the present disclosure is not limited to the structure. If necessary, the present disclosure may be applied to a structure in which internal electrodes are laminated in the Y direction.

Ends of the first and second internal electrodes 121 and 122 may be exposed through the third and fourth surfaces 3 and 4 of the capacitor body 110, respectively.

The ends of the first and second electrodes 121 and 122 alternately exposed through the third and fourth surfaces 3 and 4 of the capacitor body 110 may be connected to the first and second external electrodes 131 and 132 disposed on both ends in the X direction of the capacitor body 110, which will be described later, to be electrically connected thereto, respectively.

According to the above-described configuration, charges are accumulated between the first and second internal electrodes 121 and 122 when a predetermined voltage is applied to the first and second external electrodes 131 and 132.

In this case, capacitance of the multilayer capacitor 100 may be proportional to an overlapping area between the first and second internal electrodes 121 and 122 overlapping each other in the active region in the Y direction.

The first and second internal electrodes 121 and 122 may be formed using a conductive paste formed of at least one of a noble metal material such as platinum (Pt), palladium (Pd), and a palladium-silver (Pd—Ag) alloy, nickel (Ni), and copper (Cu), but a material thereof is not limited thereto.

The conductive paste may be printed by means of a screen printing method, a gravure printing method, or the like, but the printing method is not limited thereto.

In the present embodiment, an internal electrode of the capacitor body 110 is shown as being laminated in a direction perpendicular to the first surface 1 which is a mounting surface. However, an internal electrode of the present disclosure may be laminated in a direction horizontal to the mounting surface, if necessary.

The first and second external electrodes 131 and 132 may be provided with voltages having different polarities and may be disposed on both ends in the X direction of the capacitor body 110. The first and second external electrodes 131 and 132 may be respectively connected to exposed ends of the first and second internal electrodes 121 and 122 to be electrically connected to each other.

The first external electrode 131 may include a first head portion 131a and a first band portion 131b.

The first band portion 131a is disposed on the third surface 3 of the capacitor body 110 and is in contact with an end exposed outwardly of the first internal electrode 121 through the third surface 3 of the capacitor body to electrically connect the first internal electrode 121 to the first external electrode 131.

The first band portion 131b is a portion extending from the first head portion 131a to portions of the first, second, fifth, and sixth surfaces 1, 2, 5, and 6 of the capacitor body 110 to improve fixing strength or the like.

The second external electrode 132 may include a second head portion 132a and a second band portion 132b.

The second head portion 132a is disposed on the fourth surface 4 of the capacitor body 110 and is in contact with an end exposed outwardly of the second internal electrode 122 through the fourth surface 4 of the capacitor body 110 to electrically connect the second internal electrode 122 to the second external electrode 132.

The second band portion 132b is a portion extending from the head portion 132a to portions of the first, second, fifth, and sixth surfaces 1, 2, 5, and 6 of the capacitor body 110 to improve fixing strength or the like.

The first and second external electrodes 131 and 132 may further include a plating layer.

The plating layer may include first and second nickel (Ni) plating layers and first and second tin (Sn) plating layers covering the first and second nickel plating layers, respectively.

Figure 5:
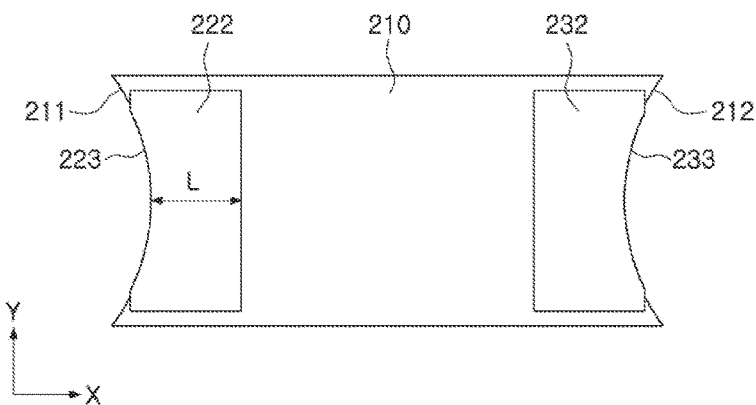
FIG. 5 is a plan view of an interposer applied to FIG. 1.

Further referring to FIG. 5, the interposer 200 according to the present embodiment will now be described. The interposer 200 includes an interposer body 210 and first and second external terminals 220 and 230 disposed respectively on both ends in the X direction of the interposer body 210.

In this case, the interposer 200 may have an X-direction length of 2.0 mm or more and a Y-direction width of 1.2 mm or more.

The interposer body 210 may include an insulating board formed of an insulating resin.

The interposer body 210 has a substantially rectangular shape when viewed in X-Y and first and second ends of the interposer body are provided with first and second grooves 211 and 212 having curved surfaces are formed in the X direction, respectively.

Each of the first and second grooves 211 and 212 may serve as a solder accommodation groove in which a solder is filled when an electronic component is mounted.

The interposer body 210 may be disposed to have a X-direction length and a Y-direction width respectively smaller than or equal to the X-direction length and the Y-direction width of the capacity body 110.

The first and second external terminals 220 and 230 may be provided with voltages having different polarities and may be respectively connected to the first and second band portions 131b and 132b of the first and second external electrodes 131 and 132 to be electrically connected to each other.

The first external terminal 220 includes a first bonding portion 222, a first mounting portion 221, and a first connection portion 223.

The first bonding portion 222, the first mounting portion 221, and the first connection portion are formed of a conductive metal.

The first bonding portion 222 is disposed on a top surface of the interposer body 210 and has one end exposed through one surface in the X direction of the interposer body 210 and connected to the first band portion 131b of the first external electrode 131.

The first mounting portion 221 is disposed on a bottom surface of the interposer body 210 to face the first boding portion 222 in the Z direction and may serve as a terminal during board mounting.

The first connection portion 223 is disposed on the first groove 223 formed on an end surface in the X direction of the interposer body 210 and is connected to an end of the first bonding portion 222 and an end of the first mounting portion 221 to electrically connect the second bonding portion 232 to the second mounting portion 231.

In the case, a first adhesive 321 may be provided between the first bonding portion 222 and the first band portion 131b in such a manner that the first bonding portion 222 and the first band 131b are bonded to each other.

The first adhesive 321 may be a high melting-point solder or the like.

The high melting-point solder may include at least one of antimony (Sb), cadmium (Cd), zinc (Zn), aluminum (Al), and copper (Cu).

The first adhesive 321 is disposed to extend to a portion of the first connection portion 223. When a height when the first adhesive 321 falls from the first adhesive 321 along the first connection portion 223 of the first external terminal 220 of the interposer 200 is defined as T2, a minimum length in the X direction of the first bonding portion 222 is defined as L, and a height of an electronic component is defined as T1, $(L+T2^2)/T1$ may satisfy $1.55 \leq (L+T2^2)/T1$.

The second external terminal 230 includes a second bonding portion 232, a second mounting portion 231, and a second connection portion 233.

The second bonding portion 232, the second mounting portion 231, and the second connection portion 233 may be formed of a conductive metal.

The second bonding portion 232 is exposed to a top surface of the interposer body 210 and has an end exposed through the other surface in the X direction of the interposer body 210 and connected to the second band portion 132b of the second external electrode 132.

The second mounting portion 231 may be disposed on the bottom surface of the interposer body 210 to face the second bonding portion 232 in the Z direction and may serve as a terminal during board mounting.

The second connection portion 233 is disposed on a second groove 212 formed on the other end surface in the X direction of the interposer body 210 and is connected to an end of the second bonding portion 232 and an end of the second mounting portion 231 to electrically connect the second bonding portion 232 to the second mounting portion 231.

In this case, a second adhesive 322 may be provided between the second bonding portion 232 and the second band portion 132b in such a manner that the second bonding portion 232 and the second mounting portion 231 are bonded to each other.

The second adhesive 322 may be a high melting-point solder or the like.

The second adhesive 322 may extend to a portion of the second connection portion 233. When a height when the second adhesive 322 falls from the second adhesive 322 along the second connection portion 233 of the second external terminal 230 of the interposer 200 is defined as T2, a minimum length in the X direction of the first bonding portion 222 is defined L, and a height of an electronic component is defined as T1, $(L+T2^2)/T1$ may satisfy $1.55 \leq (L+T2^2)/T1$.

A plating layer may be further provided on surfaces of the first and second external terminals 220 and 230, if necessary.

The plating layer may include a nickel (Ni) plating layer and a tin (Sn) plating layer covering the nickel plating layer.

When voltages having different polarities are applied to the first and second external electrodes 131 and 132 disposed in the electronic component 100 while the electronic component 100 is mounted on the board, the capacitor body 110 is expanded and contracted in the Z direction by inverse piezoelectric effect of the dielectric layer 111.

Both ends of the first and second external electrodes 131 and 132 are expanded and contracted by Poisson effect in contrast to expansion and contraction in the Z direction of the capacitor body 110, resulting in generation of vibrations.

The vibrations may be transferred to the board through the first and second external electrodes 131 and 132 and the first and second external terminals 220 and 230. Accordingly, an acoustic is emitted to cause acoustic noise.

In the present embodiment, the interposer 200 is attached to a first surface side that is a direction in which the multilayer capacitor 100 is mounted. Accordingly, the interposer 200 may serve to prevent the vibrations of the multilayer capacitor 100 from being transferred to the board to reduce the acoustic noise of the multilayer capacitor 100.

In the present embodiment, a multilayer capacitor and an interposer may be coupled to each other by an adhesive such as a high melting-point solder.

In this case, since a bonding area of the multilayer capacitor and the interposer is decreased as the amount of the high melting-point solder is increased, vibrations transferred from the multilayer capacitor to a board may be reduced more effectively.

However, since fixing strength is reduced when the bonding area of the multilayer capacitor and the interposer is decreased, there is increasing possibility that the multilayer capacitor and the interposer may be unexpectedly separated from each other.

When the amount of the high melting-point solder is too great, the amount of a solder used to mount the board is limited while the high melting-point solder falls along a connection portion of an external terminal of the interposer. As a result, fixing strength to the board may be reduced.

In addition, when the amount of the high melting-point solder is too great, the electronic component increases in overall thickness.

In detail, a bonding area is reduced as an electronic component decreases in size to 0804 or below. Accordingly, securing fixing strength became an important issue.

The present example is intended to effectively reduce acoustic noise of a small-sized electronic component and to find out the amount of a high melting-point solder to sufficiently secure fixing strength of a multilayer capacitor and an interposer as well as the amount of a typical solder.

In the present example, the suitable amount of an adhesive is limited to a length falling from an upper end of an external terminal of the interposer along a connection portion.

Experimental Example

Figure 6:
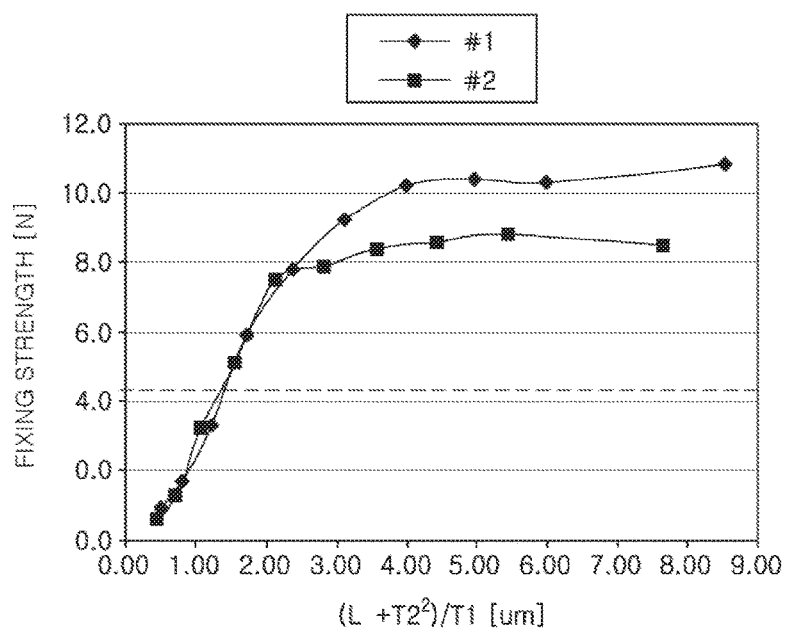
FIG. 6 is a graph showing fixing strength of an electronic component depending on correlation of a height when an adhesive falls along a connecting portion of an external terminal, a length of a bonding portion, and a height of the electronic component.

Table (1) and FIG. 6 illustrate fixing strength of an electronic component depending on correlation of a height when an adhesive falls along a connecting portion of an external terminal, a length of a bonding portion, and a height of the electronic component.

The multilayer capacitor 100 used in each sample is fabricated to have an X-direction length of 0.6 mm, a Y-direction width of 0.3 mm, and an electrical characteristic of 2.2 microfarad (μF).

In addition, the interposer 200 used in each sample is fabricated to have an X-direction length of 0.6 mm, a Y-direction width of 0.34 mm, and a Z-direction thickness ranging from 0.05 mm to 0.10 mm.

In Table (1), experiment group #1 is a case in which a Z-direction thickness of an interposer is 0.05 mm and experiment group #2 is a case in which a Z-direction thickness of an interposer is 0.10 mm.

The multilayer capacitor 100 and interposer 200 are bonded to each other using adhesives 321 and 322, which are high melting-point solders, to be fabricated as an electronic component and then mounted on a board to test fixing strength. In this case, amounts of the high melting-point solders which are the adhesives 321 and 322 are variously changed in each sample.

The amounts of the high melting-point solders used in each sample may be compared with each other by obtaining a height t, at which the adhesives 321 and 322 fall along the first connection portion 223 or the second connection portion 233 of the first terminal 220 or the second external terminal 230 of the interposer 200, using a nondestructive inspection image of an X-Z cross section of the electronic component.

In this case, the fixing strength may be confirmed by strength at the moment when the electronic component is separated from the board or the multilayer capacitor and the interposer are separated from each other by increasingly applying force to one surface of XY of an electronic component mounted on a land pattern of a board 410. In other words, the fixing strength is the force needed to either separate the interposer from the board or to separate the interposer from the multilayer capacitor.

In Table (1), T2 denotes a height when an adhesive falls along a connection portion of an external terminal, L denotes a minimum length in the X direction of a bonding portion, and T1 denotes a height of an electronic component. In addition, $(L+T2^2)/T1$ is a smaller one of both measured values of the electronic component.

In a fixing strength breakdown position, "upper" is a case in which the external electrodes 131 and 132 and the external terminals 220 and 230 bonded using an adhesive are separated first from each other, and "lower" is a case in which the external terminals 220 and 230 and a land pattern of a board 410 bonded using a solder are separated first from each other.

The fixing strength is expressed as strength when breakdown occurs in one of the "upper" and the "lower". A result of the fixing strength is shown by determining a case, in which breakdown occurs at strength less than 5 N, to be no good (NG).

TABLE 1

| Experiment Group No. | T1 [μm] | T2 [μm] | L [μm] | $(L + T2^2)/T1$ | Fixing Strength (F) [N] | Result | Separated Surface |
|---|---|---|---|---|---|---|---|
| #1 | 420 | 10 | 110 | 0.50 | 0.9 | NG | upper |
|  | 420 | 15 | 110 | 0.80 | 1.7 | NG | upper |
|  | 420 | 20 | 110 | 1.21 | 3.3 | NG | upper |
|  | 425 | 25 | 110 | 1.73 | 5.9 | OK | upper |
|  | 425 | 30 | 110 | 2.38 | 7.8 | OK | upper |
|  | 430 | 35 | 110 | 3.10 | 9.2 | OK | upper |
|  | 430 | 40 | 110 | 3.98 | 10.2 | OK | lower |
|  | 430 | 45 | 110 | 4.97 | 10.4 | OK | lower |
|  | 435 | 50 | 110 | 6.00 | 10.3 | OK | lower |
|  | 435 | 60 | 110 | 8.53 | 10.8 | OK | lower |
| #2 | 470 | 10 | 110 | 0.45 | 0.6 | NG | upper |
|  | 475 | 15 | 110 | 0.71 | 1.3 | NG | upper |
|  | 470 | 20 | 110 | 1.09 | 3.2 | NG | upper |
|  | 475 | 25 | 110 | 1.55 | 5.1 | OK | upper |
|  | 475 | 30 | 110 | 2.13 | 7.5 | OK | upper |
|  | 475 | 35 | 110 | 2.81 | 7.9 | OK | upper |
|  | 480 | 40 | 110 | 3.56 | 8.4 | OK | lower |
|  | 480 | 45 | 110 | 4.45 | 8.6 | OK | lower |
|  | 480 | 50 | 110 | 5.44 | 8.8 | OK | lower |
|  | 485 | 60 | 110 | 7.65 | 8.5 | OK | lower |

Referring to Table (1) and FIG. 6, in the case of samples in which $(L+T2^2)/T1$ is less than 1.55, fixing strength between an external electrode and an external terminal was not sufficiently secured. Thus, an upper portion of an electronic component was broken down at a strength less than 5.0 N.

It was confirmed that, in all samples, a lower portion of an electronic component withstood a force of at least 5.0 N.

Accordingly, $(L+T2^2)/T1$ should be 1.55 or more to secure a certain level of fixing strength between the external electrodes 131 and 132 and the external terminals 220 and 230 as well as a certain level of fixing strength between the external terminals 220 and 230 and the land pattern of the board.

For example, the fixing strength is inversely proportional to a height T1 of a chip and is proportional to a squared value of T2 and L.

The reason why the fixing strength is proportional to the square of T2 is that a direction of T2 is perpendicular to a direction in which a force is applied when the fixing strength is measured.

As described above, acoustic noise reduction effect of an electronic component may be maintained at a certain level or more. Additionally, fixing strength of a certain level or higher may be secured during board mounting to prevent poor mounting.

While exemplary embodiments have been shown and described above, it will be apparent to those skilled in the art that modifications and variations could be made without departing from the scope of the present invention as defined by the appended claims.

What is claimed is:

1. An electronic component comprising:
   a multilayer capacitor including a capacitor body, and a pair of external electrodes disposed on both ends of the capacitor body in a length direction, respectively; and
   an interposer including an interposer body having both ends in the length direction in which grooves are formed, respectively, and a pair of external terminals disposed on the both ends of the interposer body, respectively,
   wherein the external terminal includes a bonding portion disposed on a top surface of the interposer body and connected to the respective external electrodes, a mounting portion disposed on a bottom surface of the interposer body, and a connection portion disposed in a groove of the interposer body to connect the bonding portion and the mounting portion to each other, an adhesive is provided between the external electrode and the bonding portion, and wherein the adhesive falls along the connection portion of the external terminals, and wherein $1.55 \leq (L+T2^2)/T1$ in which T2 is a height at which the adhesive falls along the connection portion of each of the external terminals, L is a length of the bonding portion, and T1 is a height of the electronic component.

2. The electronic component of claim 1, wherein the multilayer capacitor has a height of 0.7 millimeters or less.

3. The electronic component of claim 1, wherein the adhesive is a high melting-point solder.

4. The electronic component of claim 1, wherein the interposer body is formed of an insulating board.

5. The electronic component of claim 1, wherein the capacitor body has first and second surfaces disposed to oppose each other in a height direction, third and fourth surfaces connected to the first and second surfaces and disposed to oppose each other in the length direction, and fifth and sixth surfaces connected to the first and second surfaces as well as the third and fourth surfaces and disposed to oppose each other in a width direction, the capacitor including a plurality of dielectric layers and a plurality of first and second internal electrodes alternately disposed to have the dielectric layer interposed between the first and second internal electrodes in the height direction, and one end of the first internal electrode and one end of the second internal electrode are exposed through the third surface and the fourth surface, respectively.

6. The electronic component of claim 5, wherein the external electrodes comprise:

head portions disposed on the third and fourth surfaces of the capacitor body, respectively, and connected to the first and second internal electrodes, respectively; and band portions extending to portions of the first surface of the capacitor body from the head portions and connected to the bonding portion.

7. The electronic component of claim 1, further comprising:

a plating layer respectively provided on surfaces of the external electrodes and the external terminals.

8. The electronic component of claim 7, wherein the plating layer comprises a nickel plating layer and a tin plating layer covering the nickel plating layer.

9. The electronic component of claim 1, wherein the multilayer capacitor has a length of 0.8 millimeter or less and a width of 0.4 millimeter or less.

10. An electronic component comprising:

a multilayer capacitor comprising a capacitor body, a first external electrode disposed on a first end surface of the capacitor body and a second external electrode disposed on a second end surface of the capacitor body opposing the first end surface in a length direction;

an interposer including an interposer body having a first concave end surface and a second concave end surface opposing each other in the length direction, and first and second external terminals each including a bonding portion disposed on a top surface of the interposer body, a connecting portion disposed on a corresponding concave end surface and amounting portion disposed on a bottom surface of the interposer body, the first and second external terminals being spaced apart from each other; and an adhesive disposed between the first and second external electrodes and bonding portions respectively of the first and second external terminals, the adhesive falling along a corresponding connecting portion, wherein $1.55 \leq (L+T2^2)/T1$ where T2 is a height at which the adhesive falls along the corresponding connection portion, L is a length of the bonding portion, and T1 is a height of the electronic component.

11. The electronic component of claim 10, wherein the adhesive comprises a high-melting point solder.

12. The electronic component of claim 10, wherein the interposer body comprises an insulating board.

13. The electronic component of claim 10, wherein the capacitor body comprises dielectric layers stacked in a height direction, and first and second internal electrodes being disposed alternately on the dielectric layers, an end the first and second internal electrodes being exposed respectively to the first and second external electrodes.

14. The electronic component of claim 10, wherein a portion of each of the first and second external electrode extends to a bottom surface of the capacitor body forming a band portion of a corresponding external electrode.

15. The electronic component of claim 14, wherein the band portions of the first and second external electrodes are respectively connected to corresponding bonding portions of the first and second external terminals, the adhesive being disposed between the band portions and the bonding portions.

16. The electronic component of claim 10, wherein a length of the interposer body is smaller than a length of the capacitor body.

17. The electronic component of claim 10, wherein a width of the interposer body is smaller than a width of the capacitor body.

* * * * *